(12) United States Patent
Sung

(10) Patent No.: US 7,268,011 B2
(45) Date of Patent: Sep. 11, 2007

(54) DIAMOND COMPOSITE HEAT SPREADER AND ASSOCIATED METHODS

(76) Inventor: Chien-Min Sung, 64 Chung-San Road, Ying-Ko Factory, Taipei County (TW) 23911

( * ) Notice: Subject to any disclaimer, the term of this patent is extended or adjusted under 35 U.S.C. 154(b) by 0 days.

(21) Appl. No.: 10/769,554

(22) Filed: Jan. 30, 2004

(65) Prior Publication Data

US 2004/0253766 A1    Dec. 16, 2004

Related U.S. Application Data

(62) Division of application No. 10/270,018, filed on Oct. 11, 2002, now Pat. No. 7,173,334.

(51) Int. Cl.
*H01L 23/373* (2006.01)

(52) U.S. Cl. ............... 438/105; 438/122; 257/E23.111

(58) Field of Classification Search .................. 438/15, 438/25, 26, 51, 55, 64, 105, 106, 122, 584, 438/FOR. 413; 257/E23.111, E23.112
See application file for complete search history.

(56) References Cited

U.S. PATENT DOCUMENTS

| | | | |
|---|---|---|---|
| 3,574,580 A | | 4/1971 | Stromberg et al. |
| 3,678,995 A | | 7/1972 | Collard |
| 3,828,848 A | | 8/1974 | Custers et al. |
| 3,829,544 A | * | 8/1974 | Hall ........................... 264/125 |
| 3,872,496 A | | 3/1975 | Potter |
| 3,912,500 A | | 10/1975 | Vereschagin et al. |
| 3,913,280 A | | 10/1975 | Hall |
| 3,949,263 A | | 4/1976 | Harper |
| 4,231,195 A | | 11/1980 | DeVries et al. |
| 4,576,224 A | | 3/1986 | Eaton et al. |
| 4,649,992 A | | 3/1987 | Geen et al. |
| 4,948,388 A | | 8/1990 | Ringwood |
| 5,070,936 A | | 12/1991 | Carroll et al. |
| 5,096,465 A | * | 3/1992 | Chen et al. ................... 51/295 |
| 5,120,495 A | | 6/1992 | Supan et al. |
| 5,130,771 A | | 7/1992 | Burnham et al. |
| 5,382,314 A | | 1/1995 | Jin |
| 5,614,320 A | | 3/1997 | Beane et al. |
| 5,642,779 A | | 7/1997 | Yamamoto et al. |
| 5,696,665 A | | 12/1997 | Nagy |
| 5,719,441 A | | 2/1998 | Larimer |
| 5,783,316 A | | 7/1998 | Colella et al. |
| 5,786,075 A | | 7/1998 | Mishuku et al. |
| 5,895,972 A | | 4/1999 | Paniccia |
| 6,031,285 A | | 2/2000 | Nishibayashi |
| 6,039,641 A | * | 3/2000 | Sung ........................... 451/540 |
| 6,167,948 B1 | | 1/2001 | Thomas |
| 6,193,770 B1 | * | 2/2001 | Sung ........................... 51/295 |
| 6,238,454 B1 | | 5/2001 | Polese et al. |
| 6,264,882 B1 | | 7/2001 | Colella et al. |
| 6,284,315 B1 | * | 9/2001 | Tzeng ..................... 427/249.1 |
| 6,335,863 B1 | | 1/2002 | Yamamoto et al. |
| 6,337,513 B1 | | 1/2002 | Clevenger et al. |
| 6,361,857 B1 | | 3/2002 | Saito et al. |
| 6,390,181 B1 | | 5/2002 | Hall et al. |
| 6,413,589 B1 | | 7/2002 | Li |
| 6,448,642 B1 | | 9/2002 | Bewley et al. |
| 6,517,221 B1 | | 2/2003 | Xie |
| 6,538,892 B2 | | 3/2003 | Smalc |
| 6,541,115 B2 | * | 4/2003 | Pender et al. ............... 428/408 |
| 2002/0023733 A1 | * | 2/2002 | Hall et al. .................. 165/80.3 |

FOREIGN PATENT DOCUMENTS

| | | | |
|---|---|---|---|
| GB | 1382080 | * | 1/1975 |
| JP | 09312362 A | * | 12/1997 |
| WO | WO 0148816 A1 | * | 7/2001 |

OTHER PUBLICATIONS

English translation of WO 200148816 A1 (Ishikawa et al.).*
Horton, M. D., B. J. Pope and H. T. Hall, "Sintered Diamond," International Industrial Diamond Association Symposium, Washington, D. C. (1974).
Pope, B. J., M. D. Horton, H. T. Hall, L. S. Bowman and H. Adaniya, "Sintered Diamond: Its Possible Use as a High Thermal Conductivity Semiconduction Device Substrate," Proc. 4th International Conference on High Pressure (Airapt), Kyoto, Japan (1974).
Hall, T. Tracy, "Sintered Diamonds," SCIENCE, vol. 169, Aug. 28, 1970.

* cited by examiner

*Primary Examiner*—Marcos D. Pizarro
(74) *Attorney, Agent, or Firm*—Thorpe North & Western LLP

(57) ABSTRACT

Diamond heat spreaders are produced having thermal properties approaching that of pure diamond. Diamond particles of relatively large grain size are tightly packed to maximize diamond-to-diamond contact. Subsequently, smaller diamond particles may be introduced into the interstitial voids to further increase the diamond content per volume. An interstitial material is then introduced which substantially fills the remaining voids and should have favorable thermal properties as well as form chemical bonds with the diamond. Alternatively, the packed diamond may be subjected to ultrahigh pressures over 4 GPa in the presence of a sintering aid. The resulting diamond heat spreader has diamond particles which are substantially sintered together to form a continuous diamond network and small amounts of a sintering agent. The final heat spreader exhibits superior heat transfer properties advantageous in removing heat from various sources such as electronic devices and minimized difference in thermal expansion from the heat source.

9 Claims, No Drawings

DIAMOND COMPOSITE HEAT SPREADER AND ASSOCIATED METHODS

CLAIM OF PRIORITY

This application is a divisional application of U.S. patent application Ser. No. 10/270,018, filed Oct. 11, 2002 now U.S. Pat. No. 7,173,334, which is hereby incorporated by reference.

FIELD OF THE INVENTION

The present invention relates to diamond composite devices that can be used to conduct or absorb heat away from a heat source. Accordingly, the present invention involves the fields of chemistry, physics, and materials science.

BACKGROUND OF THE INVENTION

Progress in the semiconductor industry has been following the trend of Moore's Law that was proposed in 1965 by then Intel's cofounder Gordon Moore. This trend requires that the capability of integrated circuits (IC) or, in general, semiconductor chips double every 18 months. Thus, the number of transistors on a central processing unit (CPU) in 2002 may approach 100 million. As a result of this densification of circuitry, line-width in 2002 narrowed to 0.18 micrometer and more advanced chips are using wires as thin as 0.13 micrometer. With this trend continuing, it is projected that the seemingly impermeable "Point One" barrier, of 0.1 micrometer, will be attained and surpassed in the next few years.

Along with such advances comes various design challenges. One of the often overlooked challenges is that of heat dissipation. Most often, this phase of design is neglected or added as a last minute design before the components are produced. According to the second law of thermodynamics, the more work that is performed in a closed system, the higher entropy it will attain. With the increasing power of a CPU, the larger flow of electrons produces a greater amount of heat. Therefore, in order to prevent the circuitry from shorting or burning out, the heat resulting from the increase in entropy must be removed. The state-of-the-art CPU in 2002 has a power of about 60 watts (W). CPUs made with 0.13 micrometer technology will exceed 100 watts. Current methods of heat dissipation, such as by using metal (e.g., Al or Cu) fin radiators, and water evaporation heat pipes, will be inadequate to sufficiently cool future generations of CPUs.

Recently, ceramic heat spreaders (e.g., AlN) and metal matrix composite heat spreaders (e.g., SiC/Al) have been used to cope with the increasing amounts of heat generation. However, such materials have a thermal conductivity that is no greater than that of Cu, hence, their ability to dissipate heat from semiconductor chips is limited.

A typical semiconductor chip contains closely packed metal conductor (e.g., Al, Cu) and ceramic insulators (e.g., oxide, nitride). The thermal expansion of metal is typically 5-10 times that of ceramics. When the chip is heated to above 60° C., the mismatch of thermal expansions between metal and ceramics can create microcracks. The repeated cycling of temperature tends to aggravate the damage of the chip. As a result, the performance of the semiconductor will deteriorate. Moreover, when temperatures reach more than 90° C., the semiconductor portion of the chip may become a conductor so the function of the chip is lost. In addition, the circuitry may be damaged and the semiconductor is no longer usable (i.e. becomes "burned out"). Thus, in order to maintain the performance of the semiconductor, its temperature must be kept below a threshold level (e.g., 90° C.).

A conventional method of heat dissipation is to contact the semiconductor with a metal heat sink. A typical heat sink is made of aluminum that contains radiating fins. These fins are attached to a fan. Heat from the chip will flow to the aluminum base and will be transmitted to the radiating fins and carried away by the circulated air via convection. Heat sinks are therefore often designed to have a high heat capacity to act as a reservoir to remove heat from the heat source.

The above heat dissipation methods are only effective if the power of the CPU is less than about 60 W. For CPUs with higher power, more effective means must be sought to keep the hot spot of the chip below the temperature threshold.

Alternatively, a heat pipe may be connected between the heat sink and a radiator that is located in a separated location. The heat pipe contains water vapor that is sealed in a vacuum tube. The moisture will be vaporized at the heat sink and condensed at the radiator. The condensed water will flow back to the heat sink by the wick action of a porous medium (e.g., copper powder). Hence, the heat of a semiconductor chip is carried away by evaporating water and removed at the radiator by condensing water.

Although heat pipes and heat plates may remove heat very efficiently, the complex vacuum chambers and sophisticated capillary systems prevent designs small enough to dissipate heat directly from a semiconductor component. As a result, these methods are generally limited to transferring heat from a larger heat source, e.g., a heat sink. Thus, removing heat via conduction from an electronic component is a continuing area of research in the industry.

One promising alternative that has been explored for use in heat sinks is diamond-containing materials. Diamond can carry away heat much faster than any other material. The thermal conductivity of diamond at room temperature (about 2000 W/mK) is much higher than either copper (about 400 W/mK) or aluminum (250 W/mK), the two fastest metal heat conductors commonly used. Moreover, the thermal capacity of diamond (1.5 J/cm$^3$) is much lower than copper (17 J/cm$^3$) or aluminum (24 J/cm$^3$). The ability for diamond to carry away heat without storing it makes diamond an ideal heat spreader. In contrast to heat sinks, a heat spreader acts to quickly conduct heat away from the heat source without storing it. Table 1 shows various thermal properties of several materials as compared to diamond (values provided at 300 K).

TABLE 1

| Material | Thermal Conductivity (W/mK) | Heat Capacity (J/cm$^3$ K) | Thermal Expansion (1/K) |
| --- | --- | --- | --- |
| Copper | 401 | 3.44 | 1.64E−5 |
| Aluminum | 237 | 2.44 | 2.4E−5 |
| Molybdenum | 138 | 2.57 | 4.75E−5 |
| Gold | 317 | 2.49 | 1.43E−5 |
| Silver | 429 | 2.47 | 1.87E−5 |
| Silicon | 148 | 1.66 | 2.58E−6 |
| Diamond (IIa) | 2,300 | 1.78 | 1.4E−6 |

In addition, the thermal expansion coefficient of diamond is one of the lowest of all materials. The low thermal expansion of diamond makes joining it with low thermally expanding silicon semiconductor much easier. Hence, the stress at the joining interface can be minimized. The result is a stable bond between diamond and silicon that does not delaminate under the repeated heating cycles.

In recent years diamond heat spreaders have been used to dissipate heat from high power laser diodes, such as that used to boost the light energy in optical fibers. However, large area diamonds are very expensive; hence, diamond has not been commercially used to spread the heat generated by CPUs. In order for diamond to be used as a heat spreader, its surface must be polished so it can make an intimate contact with the semiconductor chip. Moreover, its surface may be metallized (e.g., by Ti/Pt/Au) to allow attachment to a conventional metal heat sink by brazing.

Many current diamond heat spreaders are made of diamond films formed by chemical vapor deposition (CVD). The raw CVD diamond films are now sold at over $10/cm$^2$, and this price may double when it is polished and metallized. This high price would prohibit diamond heat spreaders from being widely used except in those applications (e.g., high power laser diodes) where only a small area is required or no effective alternative heat spreaders are available. In addition to being expensive, CVD diamond films can only be grown at very slow rates (e.g., a few micrometers per hour); hence, these films seldom exceed a thickness of 1 mm (typically 0.3-0.5 mm). However, if the heating area of the chip is large (e.g., a CPU), it is preferable to have a thicker (e.g., 3 mm) heat spreader.

As such, cost effective devices that are capable of effectively conducting heat away from a heat source, continue to be sought through ongoing research and development efforts.

SUMMARY OF THE INVENTION

Accordingly, the present invention provides diamond composite heat spreaders that can be used to draw or conduct heat away from a heat source. In one aspect, the diamond composite heat spreader may include a plurality of diamond particles which are each substantially in contact with another particle and an interstitial material which binds the diamond particles into a composite mass.

In a more detailed aspect of the present invention, each of the diamonds are in such intimate contact that there is a continuous diamond-to-diamond path to each of the diamond particles. This can be generally accomplished by first packing the diamond particles in the absence of non-diamond material. In yet a more detailed aspect, the volume content of diamond may be increased by providing a portion of diamond particles which are smaller than the first packed diamond particles. In this way, the smaller diamonds partially fill the voids between the larger particles. Several successive packing steps using various size diamonds may be performed. The resulting percent by volume of diamond in the composite may range from about 50% to about 80% using this method.

In order to bind the particles together into a composite mass, an interstitial material may be introduced which meets certain thermal properties, such as thermal conductivity, thermal capacity and thermal expansion. The interstitial material may be introduced via infiltration, sintering, or electro-deposition.

In one aspect of the present invention, the interstitial material may contain an element such as Ag, Cu, Al, Si, Fe, Ni, Co, Mn, W, and alloys or mixtures of these elements. The presence of a carbide former in the interstitial material may aid in producing a composite having intimate contact with the diamond particles and increasing thermal conductivity throughout the diamond composite.

In a still more detailed aspect of the present invention, a metal or ceramic interstitial material is introduced into the packed diamond particles. A porous ceramic material is then placed adjacent to the diamond particles prior to bonding the particles together. The diamond particles and ceramic material is then subjected to ultrahigh pressures between about 4 GPa (gigapascal) and about 6 GPa, and heated, typically by passing an electrical current through a conductor. Under these conditions, a portion of the interstitial material flows from the packed diamond into the porous ceramic, while the remaining interstitial material bonds the diamond particles together into a composite mass.

In yet another aspect of the present invention, the packed diamond particles may be sintered at an ultrahigh pressure in the presence of an interstitial material which aids in the sintering process. These interstitial materials may contain an element such as Si, Ti, Ni, Fe, Co, Cu, Mn, Cr, La, Ce, or their alloys or mixtures. Pressures of between about 4 GPa and 8 GPa and temperatures between about 1,000° C. and about 2,000° C. are applied in order to achieve substantial sintering of the diamond particles. The resulting diamond heat spreader may contain between about 70% and about 98% by volume of diamond. By sintering diamond particles together, compositions above about 90% by volume of diamond can be achieved to produce a diamond heat spreader having thermal properties approaching that of pure diamond at a fraction of the cost.

Heat spreaders of the present invention may be positioned at or near a heat source such that the heat spreader effectively conducts or carries the heat away from the heat source. Thus the present invention provides a cost effective heat spreader for use in connection with a heat source, such as semiconductor chips. In another aspect, the present invention provides a method to make heat spreaders of a variety of thicknesses and shapes which are suitable for high power consumption electronic components such as CPUs. In yet another aspect the present invention to provides a composite heat spreader having a thermal expansion coefficient which can be adjusted to match the heat source to which it is attached.

There has thus been outlined, rather broadly, various features of the invention so that the detailed description thereof that follows may be better understood, and so that the present contribution to the art may be better appreciated. Other features of the present invention will become clearer from the following detailed description of the invention, taken with the accompanying claims, or may be learned by the practice of the invention.

DETAILED DESCRIPTION

Before the present invention is disclosed and described, it is to be understood that this invention is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

It must be noted that, as used in this specification and the appended claims, the singular forms "a," "an" and, "the" include plural referents unless the context clearly dictates otherwise. Thus, for example, reference to "a diamond particle" includes one or more of such particles, reference to "an interstitial material" includes reference to one or more of such materials, and reference to "the particle" includes reference to one or more of such particles.

Definitions

In describing and claiming the present invention, the following terminology will be used in accordance with the definitions set forth below.

As used herein, "particle" and "grit" may be used interchangeably, and when used in connection with a diamond material, refer to a particulate form of such material. Such particles or grits may take a variety of shapes, including round, oblong, square, euhedral, etc., as well as a number of specific mesh sizes. As is known in the art, "mesh" refers to the number of holes per unit area as in the case of U.S. meshes. All mesh sizes referred to herein are U.S. mesh unless otherwise indicated. Further, mesh sizes are generally understood to indicate an average mesh size of a given collection of particles since each particle within a particular "mesh size" may actually vary over a small distribution of sizes.

As used herein, "substantial," or "substantially" refers to the functional achievement of a desired purpose, operation, or configuration, as though such purpose or configuration had actually been attained. Therefore, diamond particles that are substantially in contact with one another function as though, or nearly as though, they were in actual contact with one another. In the same regard, diamond particles that are of substantially the same size operate, or obtain a configuration as though they were each exactly the same size, even though they may vary in size somewhat.

As used herein, "heat spreader" refers to a material which distributes or conducts heat and transfers heat away from a heat source. Heat spreaders are distinct from heat sinks which are used as a reservoir for heat to be held in, until it can be transferred away from the heat sink by another mechanism, whereas a heat spreader do not retain a significant amount of heat, but merely transfer heat away from a heat source.

As used herein, "reactive element" and "reactive metal" may be used interchangeably, and refer to an element, especially a metal element that can chemically react with and chemically bond to a diamond by forming a carbide bond. Examples of reactive elements may include without limitation, transition metals such as titanium (Ti) and chromium (Cr), including refractory elements, such as zirconium (Zr) and tungsten (W), as well as non-transition metals and other materials, such as aluminum (Al). Further, certain non-metal elements such as silicon (Si) may be included as a reactive element in a brazing alloy.

As used herein "wetting" refers to the process of flowing a molten metal across at least a portion of the surface of a superabrasive particle. Wetting is often due, at least in part to the surface tension of the molten metal, and leads to the forming chemical bonds between the superabrasive particle and the molten metal at the interface thereof. Accordingly, a tool having superabrasive particles that are "wet" by a metal indicates the existence of chemical bonds between the superabrasive particles and the metal at the interface thereof.

As used herein, "chemical bond" and "chemical bonding" may be used interchangeably, and refer to a molecular bond that exert an attractive force between atoms that is sufficiently strong to create a binary solid compound at an interface between the atoms. Chemical bonds involved in the present invention are typically carbides in the case of diamond superabrasive particles, or nitrides or borides in the case of cubic boron nitride.

As used herein, "braze alloy" and "brazing alloy" may be used interchangeably, and refer to an alloy containing a sufficient amount of a reactive element to allow the formation of chemical bonds between the alloy and a superabrasive particle. The alloy may be either a solid or liquid solution of a metal carrier solvent having a reactive element solute therein. Moreover, the "brazed" may be used to refer to the formation of chemical bonds between a superabrasive particle and a braze alloy.

As used herein, "sintering" refers to the joining of two or more individual particles to form a continuous solid mass. The process of sintering involves the consolidation of particles to at least partially eliminate voids between particles. Sintering may occur in either a metal or diamond. Sintering of metal particles occurs at various temperatures depending on the composition of the material. Sintering of diamond particles generally requires ultrahigh pressures and the presence of a carbon solvent as a diamond sintering aid, and is discussed in more detail below. Sintering aids are often present to aid in the sintering process and a portion of such may remain in the final product.

Concentrations, amounts, particle sizes, volumes, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited.

As an illustration, a numerical range of "about 1 micrometer to about 5 micrometers" should be interpreted to include not only the explicitly recited values of about 1 micrometer to about 5 micrometers, but also include individual values and sub-ranges within the indicated range. Thus, included in this numerical range are individual values such as 2, 3, and 4 and sub-ranges such as from 1-3, from 2-4, and from 3-5, etc.

This same principle applies to ranges reciting only one numerical value. Furthermore, such an interpretation should apply regardless of the breadth of the range or the characteristics being described.

The Invention

The present invention encompasses devices and methods for transferring heat away from a heat source. Heat spreaders made in accordance with the method of the present invention contain a plurality of diamond particles, each substantially in contact with one another. The plurality of diamond particles may be bound together using an interstitial material or by sintering of the diamond particles.

In either case, a first plurality of diamond particles are packed in a suitable mold. The first plurality of diamond particles are each approximately the same mesh size. The specific size of these particles is up to about 18 mesh (1 mm) with sizes between about 30 mesh (0.5 mm) and about 400 mesh (37 micrometers) being typical. The size of these diamond particles may vary but it is recognized that larger diamond particles provide for a larger path having the desirable heat transfer characteristics which approach that of pure diamond. These diamond particles are packed such that there is substantial diamond-diamond contact between particles. Each particle should be in contact with at least one other particle in the packed group. Thus, there may be groups of particles which are in contact with one another separate from the remaining particles. In another aspect of the present invention the contact between diamond particles may be sufficient to provide a continuous diamond-to-diamond path to substantially all of the diamond particles in the heat spreader. The transfer of heat away from the heat source is facilitated when there is substantial diamond-diamond contact, as opposed to empty voids or other non-diamond material. The diamond particles are packed so as to occupy most of the volume and minimize the amount of empty void between particles.

An interstitial material may be used in connection with the diamond particles in order to bond the diamond particles together into a composite mass as is discussed in more detail below. By packing the particles prior to introduction of the interstitial material, the original diamond-to-diamond contact can be maintained so the packing efficiency may exceed one-half. This method can achieve a diamond volume packing efficiency of up to two-thirds. In contrast, if the diamond particles are mixed with an interstitial material and then sintered by hot pressing, the consolidated mass is likely to contain less than one-half of the volume as diamond. This is because interstitial material tends to fill around diamond particles and between them. In this case, diamond particles are separated by the consolidated interstitial material and heat must cross significant areas of non-diamond material.

In an additional aspect of the present invention, even higher packing efficiency may be achieved by packing diamond particles of different sizes in successive stages. For example, a larger diamond is packed into a suitable mold. The packing of the diamond particles may be improved by settling or otherwise compacting, e.g., agitated inside the mold by a vibrator. A plurality of smaller diamond particles may then be added to fill the voids surrounding the larger diamond particles. Depending on the size of the smaller diamond, the smaller diamond may need to be introduced from multiple sides of the packed diamond in order to fill most of the available voids. The size of the smaller diamond may vary. Typically particles in the range of between about $1/3^{rd}$ to about $1/20^{th}$ of the diameter of the larger diamond will increase the packing efficiency. Particles which are between about $1/5^{th}$ and about $1/10^{th}$ may also be used, while particles $1/7^{th}$ the diameter of the larger particles have been used with good results. Using such successive packing stages, the volume packing efficiency may reach two-thirds. If necessary, addition of even smaller diamond particles may be performed to increase the packing efficiency further. However, this successive packing method will soon reach a point of diminishing returns as the filling becomes more and more difficult while the increase in packing efficiency becomes less and less. Ultimately, the packing efficiency will asymptotically approach a level of about three-fourths. The packed diamond particles made in accordance with the above principles in mind will provide a diamond volume content of between about 50% and about 80%.

In an alternative embodiment, the different size diamond particles are mixed first and then packed together prior to introduction of the interstitial material. This approach allows for an increase in packing efficiency; however some thermal benefits may be sacrificed as a result of the larger diamonds not being in intimate contact with other larger particles. Thus, heat must cross a greater number of diamond-diamond interface boundaries increasing the thermal resistance of the final heat spreader.

In yet another alternative embodiment, the volume of diamond is increased by using uniformly shaped diamond particles. In particular, substantially cubic diamond particles are commercially available although other shapes could be used. The cubic diamonds may be packed edge-to-edge to produce a layer, or layers, of packed diamond particles with a diamond volume content of up to about 90%. The specific arrangement is unimportant and the particles may be packed in ordered rows and columns or the rows and columns may be staggered. In this embodiment, the arrangement of diamond particles allows for substantially smaller volume of void between particles without sintering the diamond particles together. In addition, the thermal properties of the final composite are improved if the particles are all oriented in the same direction as opposed to random directions. The following discussions of interstitial materials and processing apply to this arrangement of packed diamond particles as to the above described packed diamond particles.

The present invention encompasses a diamond composite heat spreader which takes advantage of the unique thermal properties of diamond and reducing the manufacturing cost of such heat spreaders. Diamond synthesized under ultra-high pressure can grow more than 1000 micrometers per hour and is much faster than 1-10 micrometers per hour for typical CVD processes. Consequently, the cost of high-pressure synthesized diamond is significantly lower ($0.05 per carat) than the cost for CVD diamond (above $4 per carat). However, unlike CVD diamond that is grown as a film, high-pressure diamond is provided in particulate form. It would be desirable to bond diamond particles together to form a continual network of diamond. However, in addition to being the hardest material known, diamond is also the most inert. Hence, there are currently no easy ways to chemically bond diamond particles together.

Thus, in accordance with one aspect of the present invention, the diamond particles are packed before the introduction of any non-diamond materials as discussed above. One factor to consider in designing a diamond composite heat spreader of the present invention is the thermal properties of the composite at the interfaces between diamond particles and the interfaces between non-diamond material and diamond particles. Empty voids and mere mechanical contact between diamond-diamond or non-diamond-diamond interfaces acts as a thermal barrier. Although intimate contact of diamond particles along a significant portion of the surface of diamond particles improves the thermal properties at these boundaries, the result is somewhat inferior to that of pure continuous diamond. Thus, it is desirable that a substantial portion of the interfaces are more than mere mechanical contact.

Accordingly, an interstitial material is provided with the choice of any particular interstitial material depending on the manner in which the particles are to be bound together. In one aspect of the present invention, the packed diamond particles are bound by the interstitial material, preferably by forming chemical bonds. In another aspect of the present invention, the interstitial material acts as a diamond sintering aid under ultrahigh pressure to sinter the diamond particles together.

The choice of interstitial material must account for the thermal conductivity and capacity of the interstitial material itself. A diamond compact heat spreader which contains material having a low thermal conductivity will act as a limiting element within the structure thus obviating some of the heat transfer benefits of diamond. Therefore, an interstitial material which has high thermal conductivity, low heat capacity, and provides for a chemical bond with diamond greatly facilitates the heat transfer across interface boundaries. Of course, a larger degree of diamond-diamond contact will also improve the heat transfer properties of the heat spreader.

The interstitial material for bonding or sintering of diamond particles may be provided in a number of ways including infiltration, sintering and electro-deposition. Infiltration occurs when a material is heated to its melting point and then flows as a liquid through the interstitial voids between particles. Sintering occurs when the interstitial material is heated sufficient to cause neighboring particles of material to melt near their edges and sinter neighboring particles together in an essentially solid-state process. Thus, substantially no fluid flow of the interstitial material would occur. Electro-deposition involves depositing a metal in solution on the surface of the diamond particles under an electrical current.

Two basic categories of interstitial material include liquid metal and molten ceramics. When bonding the diamond particles to produce a diamond composite heat spreader the interstitial material should contain at least one active element that will react with diamond to form carbide. The presence of a carbide former aids in the wetting of the diamond particles and causes the interstitial material to be pulled into the interstitial voids by capillary force. When sintering the diamond particles to produce a diamond heat spreader, the interstitial material should act as a sintering aid to increase the degree of diamond sintering and does not necessarily contain a carbide former but rather containing a carbon solvent.

An additional consideration in choosing an interstitial material is that the infiltration or sintering temperature of the interstitial material may not be so high as to damage the diamond. Therefore, in one aspect of the invention, the interstitial material may be an alloy that melts or sinters below about 1,100° C. When heating above this temperature, the time should be minimized to avoid excessive damage to the diamond particles. Damage to the diamond particles may also be induced internally due to cracking of the diamond from the site of metal inclusions. Synthetic diamonds always contain a metal catalyst (e.g., Fe, Co, Ni or its alloy) as inclusions. These metal inclusions have high thermal expansion coefficients and they can back-convert diamond into graphitic carbon. Hence, at high temperature, diamond will crack due to the different thermal expansion of metal inclusions or back-convert diamond to carbon.

In accordance with the present invention, interstitial materials may contain a diamond braze as a metal infiltrant or silicon alloys as ceramic infiltrants. Moreover, the infiltrant must be able to "wet" diamond so it can be wicked in the interstitial of diamond particles by capillary force. The interstitial material substantially fills any of the remaining voids between the packed diamond particles. Common diamond wetting agents include Co, Ni, Fe, Si, Mn, and Cr. When the diamond particles are to be chemically bonded together the interstitial material may contain a carbide former which provides for improved thermal properties at the boundaries between particles. Such carbide formers include Ti, V, Cr, Zr, Mo, W, Mn, Si, Fe, and Al.

Interstitial materials of the present invention may include a component such as Ag, Cu, Al, Si, Fe, Ni, Co, Mn, W, or their alloys or mixtures. Diamond brazes include Fe, Co, or Ni alloys which exhibit wetting of the diamond particles. Alloys of these brazes may also contain a carbide former such as Ti, Zr, or Cr. Ceramic silicon alloys may contain Ni, Ti, or Cr. For example, Ni—Cr alloys, such as $BNi_2$ (Ni—Cr—B) or $BNi_7$ (Ni—Cr—P) are good diamond infiltrants. Other examples of effective infiltrants include Al—Si, Cu—Sn—Ti, Ag—Cu—Ti, and Cu—Ni—Zr—Ti. Most diamond interstitial materials contain active elements (e.g., Cr, Ti) that not only bond to diamond by forming carbide, but are also easily oxidized. Hence, the introduction of interstitial materials should be performed in a vacuum furnace or under the protection of an inert atmosphere.

The above diamond composite heat spreaders can be produced by at least partially filling in the pores or gaps among diamond particles by an interstitial material that can conduct heat relatively fast. The interstitial material may be introduced into the packed diamonds in a variety of ways. One way to provide the interstitial material is by electro-deposition (e.g., Ag, Cu, and Ni) in a water solution. The metal is most often provided in an acid solution and may be performed by those skilled in this art. Various additional elements may also be added to lessen the surface tension of the solution or to otherwise improve infiltration into the voids.

Another way to provide the interstitial material is by sintering of a solid powder in the voids between diamond particles. Sintering may be accomplished in a variety of ways, known to those skilled in the art such as, but not limited to, hot pressing, pressure-less sintering, vacuum sintering, and microwave sintering. Although hot pressing is a common method, microwave sintering is becoming an increasingly useful method as it allows for faster sintering times and decreased porosity. This is particularly advantageous in the present invention because the microwave acts to primarily heat the sinterable metal material rather than the diamond. This helps to reduce degradation of the diamond during processing.

A sinterable interstitial material may be provided during the packing process, in which case the sintered material occupies much of the space between diamond particles and prevents substantial diamond-diamond contact. However, the sinterable interstitial material may be introduced in a similar manner to that used in successive packing of smaller diamond particles, wherein the size of the interstitial material is chosen so as to allow the material to partially fill the voids between diamond particles after the diamond particles have been packed. Once the voids are sufficiently filled the interstitial material is sintered. In this manner the diamond-diamond contact can be improved.

A third way to provide the interstitial material is to infiltrate diamond particles with a molten material (e.g., Al, Si, and $BNi_2$). The electro-deposited metal cannot bond diamond chemically so diamond particles are entrapped inside. Further, the sintered material may not hold diamond firmly because bonding to diamond during sintering is primarily mechanical. The infiltrant should contain an active element so it can react with diamond to form chemical bonds in the form of a carbide. The presence of a carbide former also allows the infiltrant to wet the diamond surface and draw the infiltrant further into the interstitial voids by capillary action.

In order to minimize the diamond degradation, the infiltration is preferably performed at a temperature below 1,100° C. Many of the Fe, Ni, and Co alloys mentioned above have melting temperatures in this range. During infiltration or sintering of an interstitial material, the hot metal will inevitably cause some small degree of diamond degradation. However, this effect may be minimized by reducing the processing time and carefully choosing the interstitial material. Silicon is particularly good at filling the interstitial voids between diamond particles due to its tendency to form SiC by reaction. The formation of SiC at the interface between diamond and molten Si may protect diamond from further deterioration. The melting temperature of pure Si is approximately 1,400° C. Under a high vacuum (e.g. below about $10^{-3}$ such as $10^{-5}$ torr), molten Si or its alloy can infiltrate into diamond effectively without excessively damaging diamond so a good heat spreader can be fabricated.

Thus, the interstitial material may be introduced into the packed diamond by infiltration, sintering or electro-deposition. When performed at low pressures, these interstitial materials merely fill the voids between diamond particles and bond the particles together. At very high pressures there are two basic possibilities. First, the interstitial material may chemically bond with the diamond and/or provide beneficial thermal properties across the diamond to interstitial material to diamond interface and the diamond will be partially crushed to eliminate a portion of the voids. Second, if the interstitial material is a carbon solvent such as, but not limited to, iron, cobalt, nickel or alloys of these materials, the diamond particles will sinter together to form a continuous diamond mass. When the diamond particles sinter together, the path for heat transfer is essentially a continuous diamond path having substantially no mechanical or non-diamond interfaces to traverse.

In one embodiment of the present invention, copper is used as the interstitial material. Copper is an ideal thermal conductor for making diamond heat spreaders. However, copper is not a carbon solvent and is not a catalyst for graphite to diamond conversion, nor does it act as a sintering aid at ultrahigh pressure. Hence, if copper is used as the interstitial material, it can also be done by electro-deposition or sintering. However, electro-deposition is extremely slow and inefficient in filling the pores among tightly packed diamond grains. Sintering, on the other hand, will inevitably leave copper caught between diamond grains. In either method, the diamond packing efficiency in the final diamond heat spreader is relatively low (e.g., 60% by volume).

Although copper is not a sintering aid to sinter diamond particles together along diamond grain boundaries, the ultra-high pressure consolidation of a diamond-copper mixture can force diamond grains closer together to reach a higher diamond content such as 70% by volume. Pressures may range from about 4 GPa to about 6 GPa. At these high pressures some of the diamond particles are partially crushed to eliminate a portion of the voids between particles. In order to attain over 70% by volume of diamond without forming diamond-to-diamond bridges the excess copper must be extracted by a sink material. This sink material contains pores under ultrahigh pressure conditions and would not soften at the melting temperature of copper. Such a sink material may be made of a ceramic powder such as SiC, $Si_3N_4$, and $Al_2O_3$, but may also be formed of any porous material which provides a sufficient medium for absorbing the excess copper. Other useful porous materials include WC and $ZrO_2$. This technique may be further explained by reference to Example 1 below.

Heat spreaders made in accordance with the present invention may take a variety of configurations based on the intended use. The diamond material made as described above may be polished and shaped based on the particular requirements of the heat source to which it will be applied. In contrast to CVD, the diamond composites herein can be formed to almost any size relatively quickly. Most often for electronic applications the heat spreader will be between about 1 mm and about 5 mm thick. The heat spreader may be formed into a circular or elliptical disk or a quadrilateral such as a square, rectangular or other shaped wafer. The heat source may be any electrical or other component which produces heat.

Once the heat spreader is formed, appropriate placement is based on design and heat transfer principles. The heat spreader may be in direct intimate contact with the component, and may even be formed to encompass or otherwise be contoured to provide direct contact with the heat source over a wide surface area. Alternatively, the heat spreader may be removed from the heat source by a heat conduit or other heat transfer device.

As mentioned above, the packed diamond particles may also be sintered together to form a mass of substantially sintered particles having largely only diamond. When the diamond particles are sintered together there are diamond bridges connecting neighboring diamond particles. The above-described packing methods can increase the original diamond packing efficiency. By packing different size diamond particles in successive stages the packing efficiency may be increased up to about 80% by volume. However, because there is no diamond-to-diamond bonding, the packing efficiency reaches a limit. Hence, in order to further increase the packing efficiency and the thermal conductivity, diamond particles must be sintered together. In addition, when the diamond particles are sintered together such that there are diamond bridges connecting neighboring diamond particles an uninterrupted path for heat flow is provided. In this way, heat can pass through the diamond heat spreader rapidly without being slowed down at interfaces between individual particles which are merely in intimate contact. The presence of a carbide forming interstitial material helps to improve the thermal conductivity, however such a bond is inferior in thermal properties to that of pure diamond or sintered diamond.

In order for diamond particles to sinter together, they must be heated in the stability region of diamond; otherwise, diamond will revert to the more stable form of graphite. U.S. Pat. Nos. 3,574,580; 3,913,280; 4,231,195 and 4,948,388 discuss this process in more detail and are all incorporated herein by reference. Diamond sintering is generally performed at very high pressures. Typically, pressures of more than about 4 GPa up to about 8 GPa are required, although a few processes have sought to lower this pressure requirement, e.g., U.S. Pat. No. 4,231,195. More typical sintering pressure is about 5 to about 6 GPa. At such pressures, diamond particles sinter together by a mechanism known as liquid phase sintering.

An interstitial material may be provided which acts as a diamond sintering aid. During this process, an interstitial material (e.g., Fe, Co, Ni, Si, Mn, and Cr) can wet the diamond particles. The diamond will dissolve into this interstitial material because of increased solubility at these pressures. The local pressure is higher at the contact points of the diamond particles, so diamond particles will dissolve first at these points. In contrast, the pressure in the original voids between diamond particles is low so the dissolved diamond in the form of carbon atoms in the molten liquid will precipitate out as diamond in the voids. Hence, the contacting points of diamond will gradually dissolve and the voids between the diamond particles will gradually fill with precipitated diamond. The consequence is to bring diamond particles closer beyond the original contact point and the substantial elimination of the original voids to produce a diamond structure having a composition between about 70% and about 98% by volume of diamond. In addition, unlike with the low-pressure processes described above the diamond particles will not experience any degradation because the conditions of temperature and pressure are within the stability region of diamond.

The final product of ultrahigh pressure sintering of diamond is a polycrystalline diamond (PCD) with remnant diamond grains sintered together. In such a structure, the outlines of the original diamond particles are largely lost and instead prominent diamond-to-diamond bridges are formed. If diamond sintering can be performed near completion, the entire mass will be made of diamond with small pockets of non-diamond material trapped in the original voids inside the PCD. Such a structure may contain over 95% by volume of a continuous framework of diamond and hence it is highly efficient in conducting heat and approaches the thermal properties of pure diamond.

This ultrahigh pressure process may also be applied to diamond composite heat spreaders made by sintering of metal together at a lower pressure (<2 GPa) as in the case of hot pressing mentioned above. The ultrahigh pressure process may also be used to consolidate diamond composite heat spreaders to increase the diamond content beyond what can be achieved by hot pressing alone.

Interstitial materials suitable for the ultrahigh pressure production of heat spreaders according to the method of the present invention include Si, Ti, Fe, Co, Ni, Cu, Mn, W, La, Ce, and mixture or alloys of these materials. Not all of these materials act as a sintering aid.

There are several considerations in producing diamond heat spreaders in accordance with the present invention. The goal is to take advantage of the unique thermal properties of diamond while also keeping manufacturing costs to a minimum. A high diamond volume percent in combination with using large grain diamond particles minimizes the non-diamond thermal characteristics of the final heat spreader. Further, interstitial materials having a high thermal conductivity are desirable. Intimate contact of diamond and non-diamond material at their interface reduces the volume of poor heat conducting voids. The formation of carbide bonds further enhances the heat transfer across these interfaces.

High diamond volume occupancy and large grain-size are contrary to conventional wisdom in designing such composite materials. Non-diamond material having high thermal conductivity and intimate diamond-diamond contact are contradictory to each other. Specifically Ag and Cu have high thermal conductivity, but they do not react with diamond, so the interface is a mechanical joint that may become a thermal barrier. On the other hand, Si and diamond braze (e.g., $BNi_2$ or $BNi_7$) can wet and form chemical bonds with diamond, but such materials conduct heat less effectively than Ag or Cu. Thus, using Ag or Cu in combination with a carbide former produces a product with improved thermal properties over that of composites using each alone. Not all carbide formers produce a useful product, however. For example, aluminum can react with diamond to produce a composite which conducts heat relatively fast. However, aluminum carbide located at the interface is relatively unstable, in particular with respect to hydrolysis, i.e., it may react with moisture in air. As for carbon solvents, such as Fe, Co, Ni, Mn, La, Ce, their thermal conductivity is relative poor so they are only moderately advantageous in making the diamond composite material at low pressures. In particular, these carbon solvents are also the catalyst for synthesizing diamond under ultrahigh pressure, i.e., they aid in the conversion of graphite to diamond in the stability region of diamond. However, in the stability region of graphite, these carbon solvents will also reduce diamond back to carbon at a temperature above 700° C. Hence, by sintering such elements (e.g., by hot pressing) at a high temperature, diamond may deteriorate and lose its superior thermal properties. However, at ultrahigh pressures these carbon solvents can aid in sintering the diamond grains by forming diamond-to-diamond bridges. The result is an efficient heat spreader with very high diamond content (e.g., more than 90% by volume).

In another aspect of the present invention, a sink material such as a ceramic is provided to accelerate the removal of the sintering aids. As described above, this sink material is porous and does not soften at the ultrahigh pressures used in sintering of the diamond particles. Such sink materials are most often ceramic powders such as SiC, $Si_3N_4$, and $Al_2O_3$, but may be any porous medium which can act to absorb excess sintering aid material. Other useful porous materials include WC and $ZrO_2$.

The following examples present various methods for making the coated superabrasive particles of the present invention. Such examples are illustrative only, and no limitation on the present invention is meant thereby.

EXAMPLES

Example 1

Diamond particles can be mixed with powdered copper to form a mixture. This mixture is then cold pressed to form a slug. A thin walled mold made of a refractory metal (e.g., Ti, Zr, W, Mo, and Ta) is provided. Ceramic particles (e.g., SiC, $Si_3N_4$, $Al_2O_3$) having a coarse grain size (e.g., 40/50 mesh) are first put in the mold and then the ceramic particles are covered with the diamond-copper slug. The sample assembly is then placed in a high-pressure cell and pressurize to over 5GPa. The assembly is then heat charged to over 1200° C. by passing an electric current through a heating tube that surrounds the sample assembly. At this temperature and pressure, copper melts and is forced out from between the diamond particles. The liquid copper flows to the bottom of the mold containing the ceramic particles. The ceramic particles contain ample empty pores to receive the liquid copper. In this way the diamond grains are partially crushed and substantially fill in the space left by the copper. The result is a high diamond content (e.g., 85% by volume) heat spreader. A portion of the copper remains in the composite material and is bonded to the diamond to hold the particles together.

Because of the lack of diamond-to-diamond bridges, the copper cemented diamond composite described above does not reach a diamond content of up to 95% by volume of sintered diamond as in PCD, but its diamond content is much higher than would be produced by electro-deposition or hot-pressing. Hence, the thermal conductivity would be much higher than the low-pressure diamond composite heat spreaders of the present invention. Moreover, the high thermal conductivity of copper partially compensates for the lower diamond content (about 80% by volume) when compared to PCD as the latter contains carbon solvent metals, e.g., Co, that have a lower thermal conductivity than copper.

PCD has been made routinely, but is typically designed and used exclusively for mechanical functions, such as cutting tools, drill bits, and wire drawing dies. In order to improve the mechanical finish and to increase the mechanical strength (e.g., impact strength), PCD is made of very fine diamond powder. The best PCD contains very fine diamond particles such as sub-micrometer sizes (e.g., manufactured by Sumitomo Electric Company of Japan). By utilizing PCD in a heat spreader, mechanical properties become less important. Instead of impact strength and surface finish, the diamond packing efficiency and thermal properties are the primary concern. Thus, the design of PCD for heat spreaders is distinct from that of conventional abrasive applications.

Specifically, the diamond particles of the present invention are relatively large grain sizes, and the infiltrant or sintering aid requires high thermal conductivity rather than mechanical toughness as in conventional PCD.

In order to improve the heat transfer efficiency of the heat spreader the grain boundaries of diamond particles are minimized, this is in contrast to a conventional design of diamond composites where the grain boundaries are maximized. The use of larger diamond particles not only reduces the grain boundaries that reduce heat transfer, but also serves to increase the diamond packing efficiency and further increase the thermal conductivity. Hence, this design criterion is applicable to all diamond and diamond composite heat spreaders described herein.

Example 2

30/40 mesh diamond particles (about 500 micrometers) are mixed with bronze powder (about 20 micrometers) to achieve a volume efficiency of 50%. The mixture is hot pressed in a graphite mold to a pressure of 40 MPa (400 atmospheric pressure) and heated to 750° C. for 10 minutes. The result is a diamond metal composite disk of 30 mm in diameter and 3 mm in thickness.

Example 3

30/40 mesh diamond particles are mixed with aluminum powder and loaded in an alumina tray. The charge is heated in a vacuum furnace of $10^{-5}$ torr to 700° C. for 5 minutes so the aluminum becomes molten. After cooling, result is a diamond aluminum composite.

Example 4

30/40 mesh diamond is placed inside a graphite mold and covered with NICROBRAZ LM (Wall Colmonoy) powder of −325 mesh. The load is heated in a vacuum furnace of $10^{-5}$ torr to 1010° C. for 12 minutes. The molten Ni—Cr alloy infiltrated into diamond particles to form a diamond metal composite.

Example 5

30/40 mesh diamond is placed inside a graphite mold and covered with broken silicon wafers. The load is heated in a vacuum furnace of $10^{-5}$ torr to 1470° C. for 9 minutes. The molten Si infiltrated into diamond particles to form a composite.

Example 6

30/40 mesh diamond is placed inside a graphite mold and then agitated. 220/230 mesh diamond is then placed in the mold and gently agitated until most of the voids are filled with the smaller particles. The packed diamond is then covered with NICROBRAZ LM (Wall Colmonoy) powder of −325 mesh. The load is heated in a vacuum furnace of $10^{-5}$ torr to 1,010° C. for 12 minutes. The molten Ni—Cr alloy infiltrated into diamond particles to form a diamond metal composite.

Example 7

30/40 mesh diamond is packed around a cathode and immersed in an acid bath that contains copper ions. After the current passes through, copper is gradually deposited in the pores of these diamond particles. The result is a diamond copper composite.

Example 8

20/25 mesh diamond particles (SDA-100S made by De Beers) substantially cubic in shape were aligned edge to edge on an alumina plate to form a single layer of diamond particles about 40 mm square. A silicon wafer of 0.7 mm in thickness was placed on top of this layer of particles. The assembly was then placed in a vacuum furnace and pumped down to $10^{-5}$ torr. The temperature was then raised to 1,450° C. for 15 minutes. The silicon melted and infiltrated between the diamond particles. After cooling, the composite was machined to eliminate excess silicon. The result is a diamond heat spreader of about 0.8 mm. This heat spreader contains a diamond volume of about 90%. The use of substantially cubic particles allows a much higher diamond content than can be conventionally achieved using the successive packing method described earlier.

Example 9

40/50 mesh diamond particles are mixed with a mixture of Si and Ti powders and the entire mixture is loaded inside a graphite mold that is in turn fitted inside a titanium heating tube. The assembly is placed at the center of a pyrophyllite block. This block is mounted in a cubic press and it is subjected to a pressure of 5.5 GPa. Heating is achieved by passing electrical current through the titanium tube. When the silicon melts it dissolves titanium and both flow around the diamond particles. Diamond particles then sinter with the aid of the silicon liquid. After quenching and decompression, the diamond composite is separated from the pyrophyllite and other pressure medium. The result is a diamond composite that contains about 92% by volume of diamond. Twenty such diamond composites are made each with dimensions of 20 mm in diameter and 3 mm in thickness. These diamond composite disks were polished by diamond wheels and measured for thermal conductivity that indicates a value of about twice that of copper.

Of course, it is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. Thus, while the present invention has been described above with particularity and detail in connection with what is presently deemed to be the most practical and preferred embodiments of the invention, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. A method of making a diamond composite heat spreader comprising the steps of:
   a) providing a first plurality of diamond particles having a first average mesh size;
   b) packing the diamond particles such that each diamond particle is substantially in diamond-diamond contact with at least one other diamond particle;
   c) providing an interstitial material, said interstitial material including Ag, Cu, Al, Si, or $BNi_2$;

d) providing porous ceramic material prior to the step of bonding;
e) placing the ceramic material adjacent to the packed diamond particles prior to the step of bonding; and
f) infiltrating the interstitial material into the diamond particles in a vacuum furnace at a pressure below about 10-3 torr, thereby bonding the packed diamond particles by the interstitial material with the interstitial material at least partially filling any voids between the packed diamond particles.

2. The method of claim 1, wherein infiltration is performed at a temperature below about 1,100° C.

3. The method of claim 1, wherein the step of packing further comprises packing diamonds to over 50% by volume of the heat spreader prior to providing an interstitial material.

4. The method of claim 1, wherein the diamond particles contact one another sufficiently to provide a continuous diamond-to-diamond path to substantially each of the plurality of diamond particles.

5. The method of claim 1, wherein the diamond particles have a size of from about 18 mesh to about 400 mesh.

6. The method of claim 1, wherein the interstitial material is selected from the group consisting of Al, Cu, Ag, and mixtures or alloys thereof.

7. The method of claim 1, wherein the interstitial material is a Si alloy of a member selected from the group consisting of Ni, Ti, Al, and Cr.

8. The method of claim 1, wherein the ceramic material comprises at least 50% by volume of a member selected from the group consisting of SIC, $Si_3N_4$, $Al_{2O3}$, WC, and $ZrO_2$.

9. The method of claim 8, wherein the interstitial material is copper and wherein the step of bonding is performed at a pressure between about 4 CPa and about 6 CPa.

* * * * *